United States Patent [19]

Van Veenendaal et al.

[11] Patent Number: 6,043,720
[45] Date of Patent: Mar. 28, 2000

[54] OSCILLATOR FREQUENCY DRIFT COMPENSATED BY VARYING DIFFERENT BIASSING PARAMETERS

[75] Inventors: Hendrik G. Van Veenendaal, Eindhoven; Yanling Sun, Delft, both of Netherlands

[73] Assignee: U.S. Philips Corporation, New York, N.Y.

[21] Appl. No.: 09/088,720

[22] Filed: Jun. 1, 1998

[30] Foreign Application Priority Data

Jun. 6, 1997 [EP] European Pat. Off. .............. 97201713

[51] Int. Cl.[7] ...................................................... H03L 1/00
[52] U.S. Cl. ........................................... 331/175; 331/176
[58] Field of Search ..................................... 331/175, 176

[56] References Cited

U.S. PATENT DOCUMENTS 4,255,721  3/1981  Wilson, Jr. ............................... 331/111
4,888,566  12/1989  Bong et al. .......................... 331/116 R
4,978,930  12/1990  Suter ........................................ 331/176
5,151,667  9/1992  Nishijima ............................ 331/117 R
5,180,995  1/1993  Hayashi et al. ............................ 331/57
5,440,277  8/1995  Ewen et al. .............................. 331/176

FOREIGN PATENT DOCUMENTS 0740421  10/1996  European Pat. Off. .

Primary Examiner—Siegfried H. Grimm
Attorney, Agent, or Firm—Edward W. Goodman

[57] ABSTRACT

A frequency-drift ($\Delta F$) of an oscillator (OSC) is compensated ($\approx -\Delta F$) by varying various different biassing parameters (V,I) in the oscillator. The biassing parameters (V,I) which are varied may include, for example, voltages (V) or currents (I), either exclusively or in combination, which are supplied to transistors forming part of the oscillator (OSC). The biassing parameters (V,I) may be varied as a function of temperature by one or more elements with suitably chosen temperature coefficients and/or by one or more biassing circuits which provide biassing voltages or currents which vary as a function of temperature, or both.

8 Claims, 4 Drawing Sheets

OSCILLATOR FREQUENCY DRIFT COMPENSATED BY VARYING DIFFERENT BIASSING PARAMETERS

BACKGROUND OF THE INVENTION

1. Field of the Invention

The invention relates to compensation of a frequency drift of an oscillator.

2. Description of Related Art

European Patent Application EP-A 740,421 describes a temperature-compensated piezoelectric oscillator. It is adapted to compensate for temperature dependent frequency changes of a piezoelectric vibrator used as the oscillation frequency determining element. The oscillator comprises, in addition to the vibrator, an oscillator circuit for driving the vibrator, a temperature sensor circuit for sensing the ambient temperature, and a variable power supply circuit for applying, to the oscillator circuit, a power supply voltage VDD(T) which is controlled in response to the sensed temperature by the temperature sensor circuit in such a way as to compensate the frequency-temperature characteristic of the vibrator.

If the power supply voltage supplied to an oscillator is varied, this will not only influence the frequency but also the performance of the oscillator in terms of, for example, phase noise. Consequently, if a frequency drift of the oscillator is compensated by varying the power supply voltage, there is a risk that the performance may become unacceptably low. The risk will be serious, particularly, if the supply voltage needs to be varied to a relatively large extent in order to achieve a satisfactory frequency-drift compensation. It may even be the case that, given a maximum level of the power supply voltage, the extent to which the power supply voltage can be varied is too small to achieve a satisfactory frequency-drift compensation without deteriorating the oscillator's performance.

SUMMARY OF THE INVENTION

It is an object of the invention to provide a compensation for an oscillator's frequency drift which, with respect to the background art, is better suited for a wide variety of applications.

This object is achieved, in a first aspect of the invention, in an oscillator comprising means for compensating a frequency-drift (ΔF) by varying a biassing parameter in the oscillator, characterized in that the compensating means are arranged to vary various different biassing parameters (V,I) in the oscillator.

In another aspect of the invention, a method of compensating a frequency drift of an oscillator (OSC) comprises the step of varying various different biassing parameters (V,I) in the oscillator (OSC).

In yet another aspect of the invention, an integrated circuit (IC), which has been designed to be connected to an external resonant circuit (RES) so as to form an oscillator (OSC), comprises means for compensating a frequency-drift (ΔF) of the oscillator (OSC) by varying various different biassing parameters (V,I) in. the integrated circuit (IC).

In another aspect of the invention, a receiver (REC) comprises an oscillator (OSC) which is formed by a resonant circuit (RES) coupled to an integrated circuit (IC) as described above.

In accordance with the invention, various different biassing parameters are varied to compensate an oscillator's frequency drift. In an oscillator, each different biassing parameter will influence both frequency and performance in a different manner if it is varied. Accordingly, varying various different biassing parameters provides a relatively great degree of freedom in compensating a frequency drift, on the one hand, while maintaining the performance satisfactory, on the other hand. As a result, frequency-drift compensation in accordance with the invention may be successfully applied in a relatively wide variety of applications.

If the power supply voltage is one of the biassing parameters which are varied, it needs to be varied to a relatively small extent only, because the other biassing parameters will contribute to the frequency-drift compensation. However, the power supply voltage need not be one of the biassing parameters which are varied, in which case it may be at a fixed value. In any case, because, in the invention, the power supply voltage needs to be varied to a relatively small extent only, or maybe not at all, the invention is particularly suitable for low-voltage applications.

If a certain biassing parameter is varied, the extent to which the oscillator's frequency will vary generally depends on the oscillator's frequency. For example, if the oscillator's frequency is low, it may vary to a relatively small extent in response to a variation in a certain biassing parameter whereas, if the oscillator's frequency is high, it may vary to a relatively large extent in response to the same variation. If frequency drift characteristics do not vary in substantially the same manner as a function of the oscillator's frequency, there is a risk of over- or under-compensation of the frequency drift. As, in the invention, various different biassing parameters are varied, overcompensation by one biassing parameter can be compensated by under-compensation by another biassing parameter, or vice versa. Accordingly, a satisfactory frequency-drift compensation can be obtained throughout a whole range of oscillator frequencies. Thus, the invention is particularly suitable for wideband applications in which, for example, the oscillator is tunable.

The invention may be applied to advantage in an integrated circuit which has been designed to be connected to an external resonant circuit so as to form an oscillator. In many applications, a conventional integrated circuit of this type requires one or more external components having a certain temperature coefficient to obtain satisfactory frequency-drift compensation. Furthermore, it has to be provided with a relatively large number of pins in order to suitably connect these components. In contrast, the invention enables a satisfactory frequency-drift compensation to be achieved with circuits and/or elements for varying various different biassing parameters that may be included in the integrated circuit. In that case, there will be no need for special external components to achieve a satisfactory frequency-drift compensation or, at least, relatively few such components will be needed. Furthermore, because of this, relatively few pins will be needed to connect the external resonant circuit to the integrated circuit. Thus, the invention allows greater application friendliness and pin efficiency of an integrated circuit of the type in question.

The invention may be applied in a receiver comprising an oscillator which, for example, provides a mixing carrier for converting the frequency of a reception signal. As described hereinbefore, the invention allows the oscillator to be implemented using an integrated circuit and relatively few external components. Thus, the invention contributes to ease of design and cost efficiency of such a receiver.

The invention and additional features, which may be optionally used to implement the invention to advantage, are apparent from and will be elucidated with reference to the drawings described hereinafter.

DESCRIPTION OF THE PREFERRED EMBODIMENTS

First, some remarks will be made on the use of reference signs. Similar entities are denoted by an identical lettercode throughout the drawings. In a single drawing, various similar entities may be shown. In that case, a numeral is added to the lettercode, to distinguish similar entities from each other. The numeral will be in parentheses if the number of similar entities is a running parameter.

Figure 1:
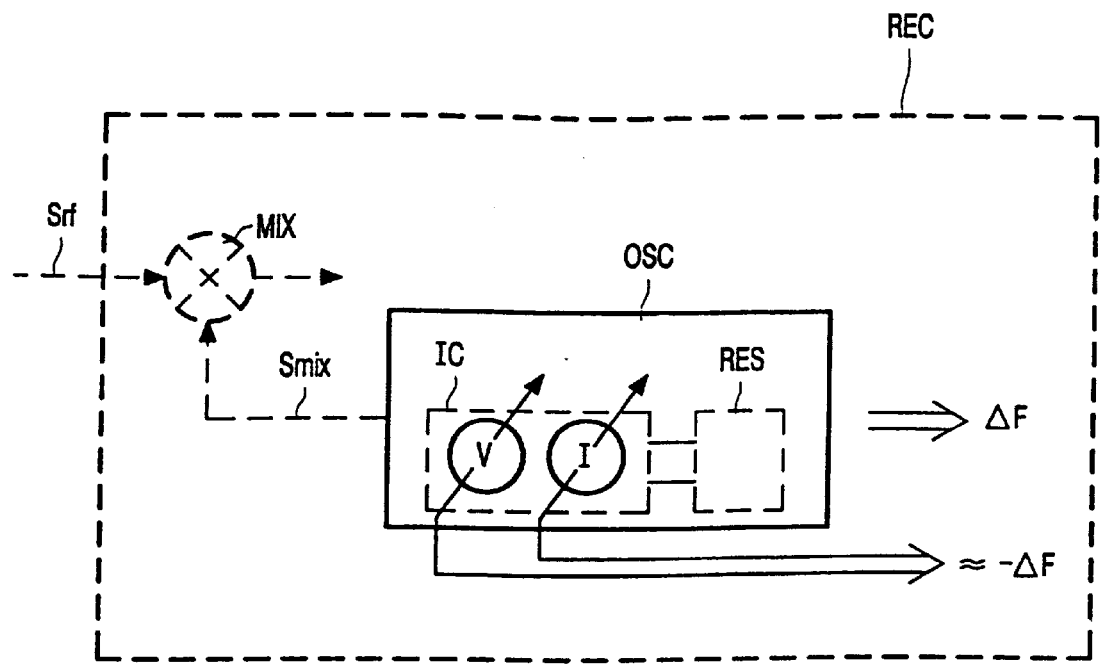
FIG. 1 is a conceptual diagram illustrating basic features of the invention.

FIG. 1 illustrates basic features of the invention in full lines. A frequency-drift $\Delta F$ of an oscillator OSC is compensated ($\approx -\Delta F$) by varying various different biassing parameters V,I in the oscillator. The biassing parameters V,I which are varied may include, for example, voltages V or currents I, either exclusively or in combination, which are supplied to transistors forming part of the oscillator. The biassing parameters may be varied as a function of temperature by means of one or more elements with suitably chosen temperature coefficients and/or by means of one or more biassing circuits which provide biassing voltages or currents which vary as a function of temperature.

FIG. 1 also illustrates the following features in broken lines. The oscillator OSC may be formed by an integrated circuit IC which is coupled to an external resonant circuit RES. The oscillator OSC may be included in a receiver REC, for example, to provide a mixing signal Smix for converting the frequency of a reception signal Srf by means of a mixer MIX.

Figure 2:
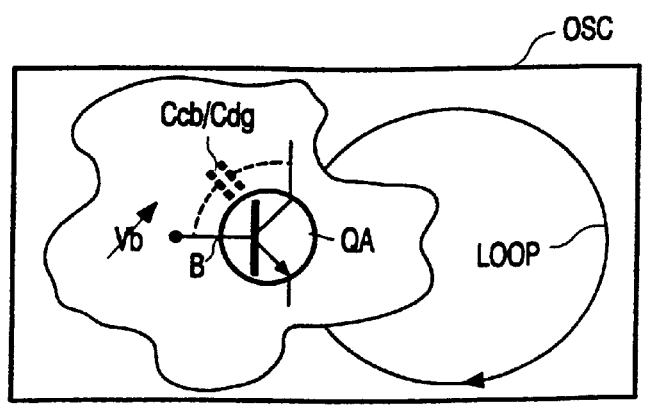
FIGS. 2 to 5 are conceptual diagrams illustrating additional features of the invention.
Figure 3:
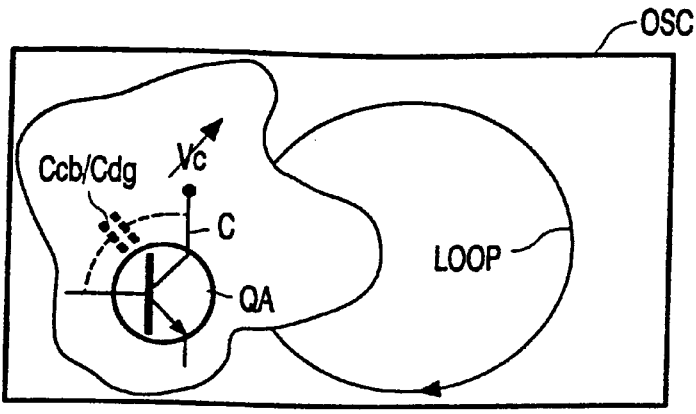
Figure 4:
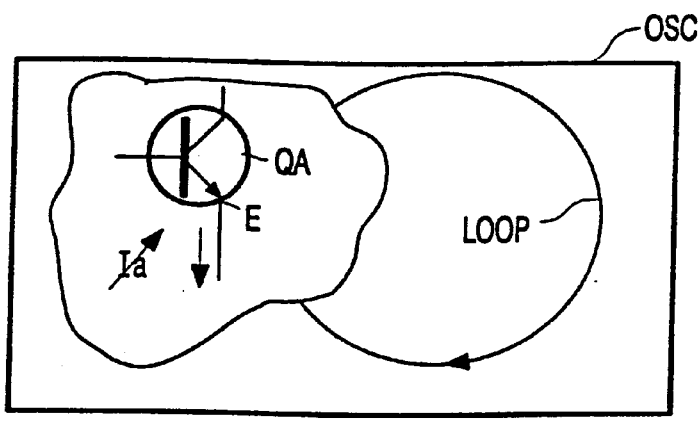

FIGS. 2, 3 and 4 illustrate additional features which have the following in common. There is an amplifying transistor QA which forms part of an oscillation loop LOOP in the oscillator OSC.

FIG. 2 illustrates that one of the biassing parameters which are varied is a biassing voltage Vb at a control terminal B of the amplifying transistor QA. By varying the voltage Vb, a capacitance Ccb/Cdg is varied, this capacitance being between collector and base, or between drain and gate, depending on whether the amplifying transistor QA is of the bipolar or the field-effect type. In most applications, the capacitance Ccb/Cdg will influence the oscillation frequency to a relatively large extent. Consequently, a relatively small variation in the biassing voltage Vb will be sufficient to provide an appreciable contribution to frequency-drift compensation. Thus, the FIG. 2 feature is particularly suited for use in low-voltage applications.

FIG. 3 illustrates that one of the biassing parameters which are varied is a biassing voltage Vc at a main current terminal C, either a collector or a drain, of the amplifying transistor QA. The biassing voltage may be varied, for example, as a function of temperature by connecting a load resistor having a suitable temperature coefficient to the main current terminal C. Since the FIG. 3 feature also produces a variation in the capacitance Ccb/Cdg mentioned hereinbefore, it provides an advantage which is similar to that of the FIG. 2 feature.

FIG. 4 illustrates that one of the biassing parameters which are varied is a biassing current Ia at a main current terminal E, either an emitter or a source, of the amplifying transistor QA. The FIG. 4 feature takes the following aspects into consideration. For most biassing parameters, the following will apply. A variation in a biassing parameter will cause a variation in a capacitance which is effectively coupled in parallel to a frequency-determining circuit of the oscillator. Such will be the case, for example, in the FIGS. 2 and 3 features discussed hereinbefore. If the frequency-determining element is tunable, the variation in oscillation frequency as a function of a certain variation in the capacitance will depend on the oscillation frequency itself. Generally, if the oscillation frequency is low, the capacitance of the frequency-determining circuit itself will be high and, consequently, the variation in the biassing parameter will influence the oscillation frequency to a relatively small extent. If, however, the oscillation frequency is high, the capacitance of the frequency-determining circuit itself will be low and, consequently, the variation in the biassing parameter will influence the oscillation frequency to a relatively large extent. This may give rise to under-compensation at low oscillation frequencies and/or over-compensation at high oscillation frequencies.

It has been found that, if the FIG. 4 feature is applied, a variation in oscillation frequency as a function of a variation in the biassing current Ia, may change in sign. For example, if the oscillation frequency is low, the oscillation frequency may decrease if the value of the biassing current Ia is increased. In contrast, if the oscillation frequency is high, the oscillation frequency may increase if the value of the biassing current Ia is increased. Such a change in sign of the oscillation-frequency variation allows any over- or under-compensation to be reduced. Thus, the FIG. 4 feature is particularly suitable for use in wideband applications in which, for example, the oscillation frequency is tunable throughout a relatively wide frequency range.

Figure 5:
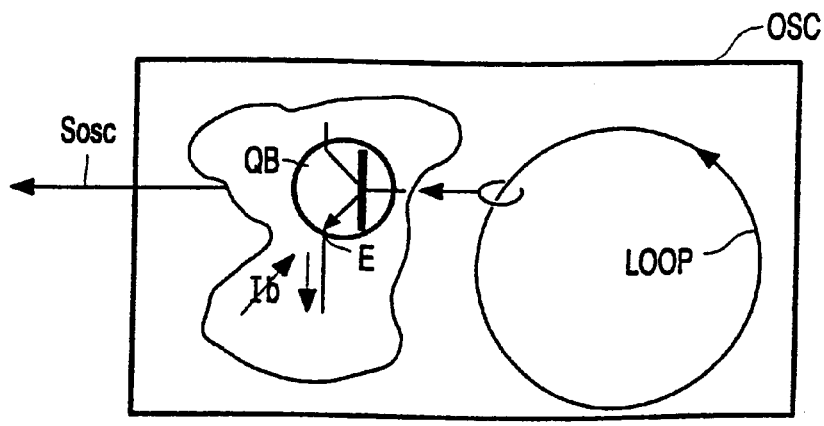

FIG. 5 illustrates the following additional feature. One of the biassing parameters which are varied is a biassing current Ib at a main current terminal E of a buffer transistor QB for deriving an oscillation output signal Sosc from an oscillation loop LOOP in the oscillator OSC. The buffer transistor QB forms a capacitive load for the oscillation loop LOOP. If the biassing current Ib is varied, the impedance of the capacitive load will vary and, consequently, the oscillation frequency will vary. Since a relatively small variation in the biassing current Ib is required to appreciably change the oscillation frequency, an advantage similar to that of the FIG. 2 feature is obtained.

Figure 6:
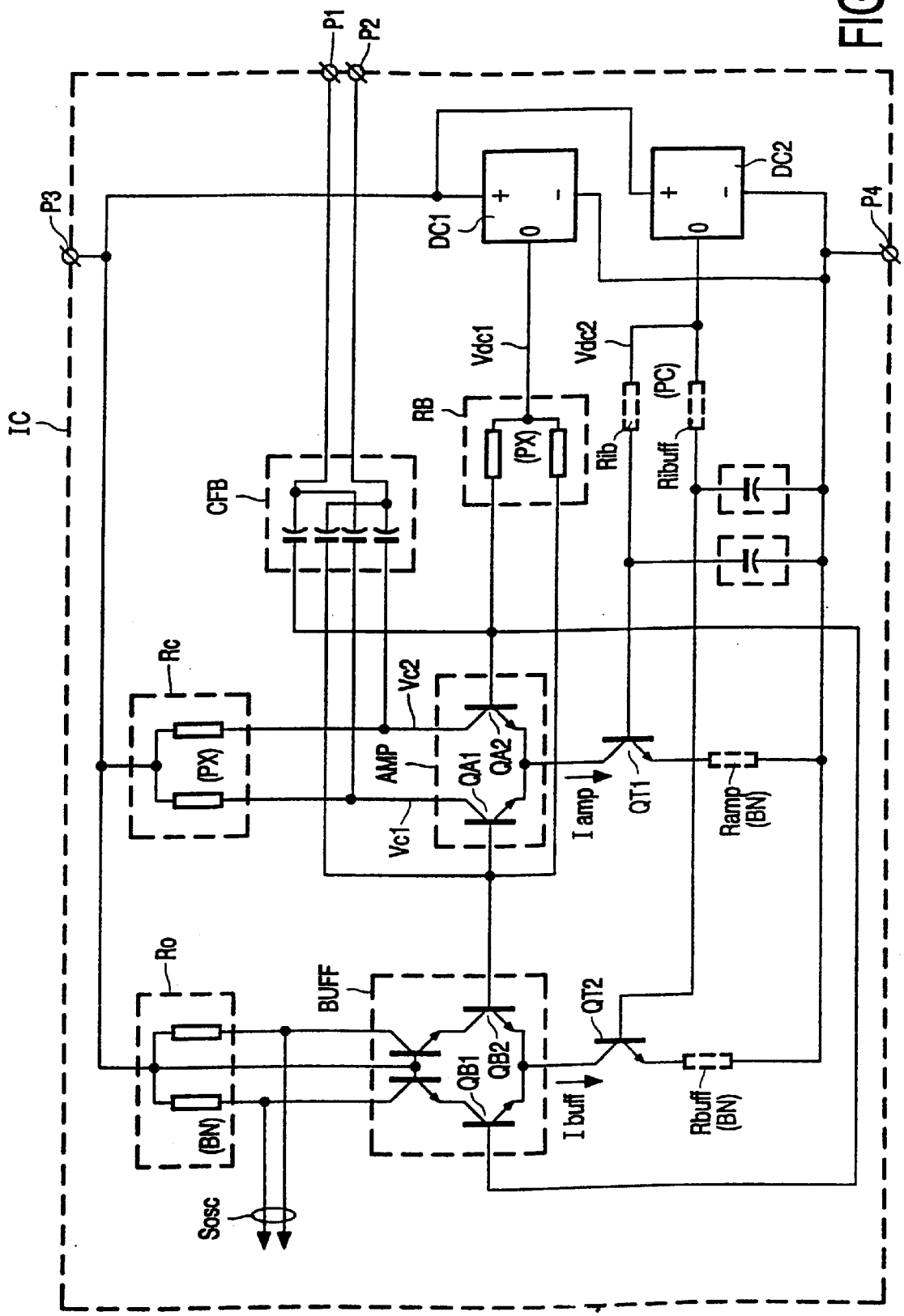
FIG. 6 is a circuit diagram of an example of an integrated circuit in accordance with the invention.

FIG. 6 illustrates an example of an integrated circuit IC in accordance with the invention. The FIG. 6 integrated circuit IC may be coupled to an external resonator circuit, not shown in FIG. 6, via two connection pins P1,P2. A differential oscillation signal Sosc will be provided on condition that a suitable power supply voltage is applied to connection pins P3,P4. The differential oscillation signal Sosc may be used, for example, to drive a mixer circuit which may also be included in the integrated circuit IC. The FIG. 6 integrated circuit IC is particularly suitable for use in televisiontuner applications in which the external resonator circuit comprises an inductor and a voltage-controlled capacitor for tuning through a television band.

The FIG. 6 integrated circuit IC comprises an amplifier AMP formed by two amplifying transistors QA1,QA2 arranged in a differential pair configuration, and a capacitive feedback network CFB. These elements form, together with the external resonant circuit, an oscillation loop. The differential oscillation signal Sosc is derived from the oscillation loop by means of a buffer BUFF in the form of a differential transistor pair QB1,QB2 which is coupled to output resistors Ro via cascode transistors.

The amplifier AMP and the buffer BUFF are biassed as follows. Biassing voltage sources DC1, DC2 provide temperature-dependent biassing voltages Vdc1, Vdc2, respectively. Biassing voltage Vdc1 is applied to the bases of the amplifying transistors QA1, QA2 in the amplifier AMP biassing via base resistors RB. Biassing voltage Vdc2 is applied to bases of tail current transistors QT1, QT2 via base resistors Rib, Ribuff, respectively, The tail current transistors QT1, QT2 provide tail currents Iamp, Ibuff for the amplifier AMP and the buffer BUFF, respectively. The relation between the tail currents Iamp, Ibuff and the biassing voltage Vdc2 depends on the value of emitter resistors Ramp, Rbuff, respectively. Collector voltages Vc1, Vc2 of the amplifying transistors QA1, QA2, respectively, depend on the value of collector resistors Rc. The resistors shown in FIG. 6 are either formed by an N-type or a P-type diffusion which, for each resistor, is denoted by, respectively, the two-letter code BN or PX in brackets. The temperature-coefficient of a resistor formed by an N type-diffusion is different from that of a resistor formed by a P-type diffusion. A correct choice of diffusion, P or N, is particularly important for the collector resistors Rc since these determine the collector voltages Vc1, Vc2 which influence the oscillation-frequency to a relatively large extent.

Figure 7A:
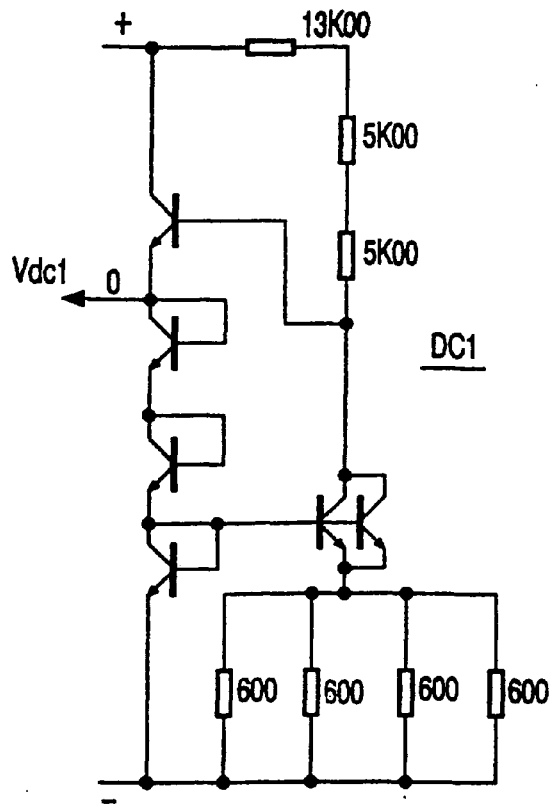
FIGS. 7a and 7b are circuit diagrams of examples of biassing voltage sources for use in the FIG. 6 integrated circuit.
Figure 7B:
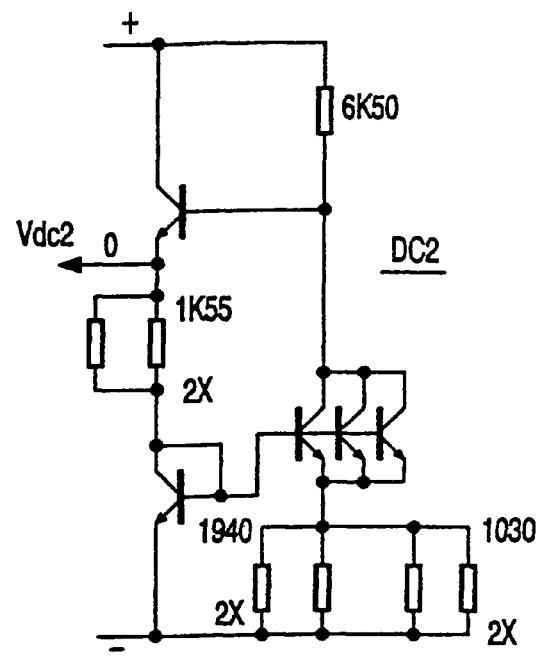
Figure 7C:
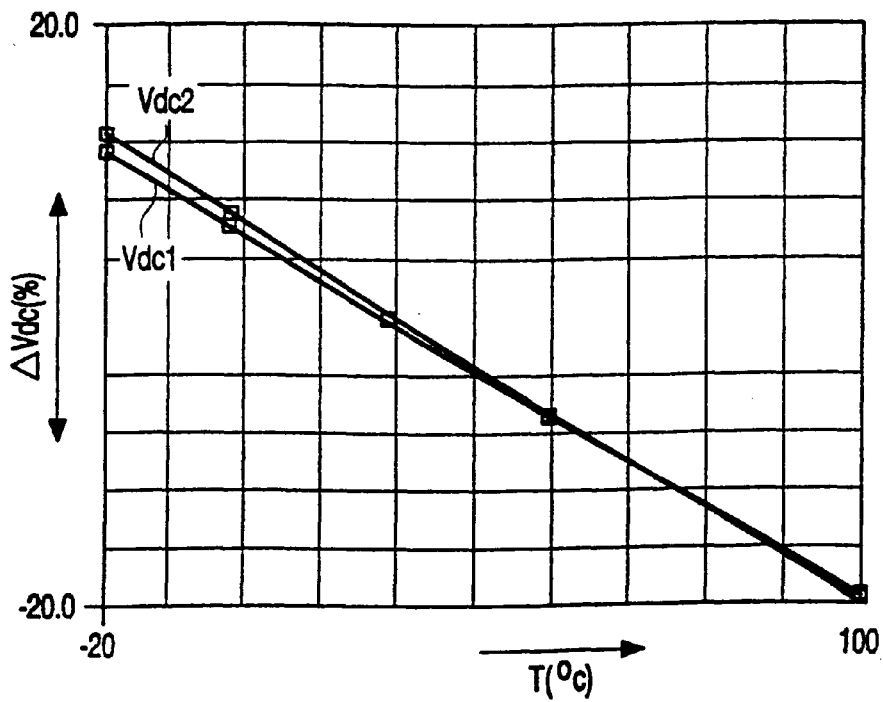
FIG. 7c is a graph illustrating voltage-versus-temperature characteristics of FIG. 7a and FIG. 7b biassing voltage sources.

FIGS. 7a and 7b illustrate examples of the biassing voltage sources DC1, DC2, respectively. The biassing voltage sources DC1, DC2 are formed by transistors and resistors whose values are given in FIG. 7a by way of example. Connections +,O,–correspond to those indicated in FIG. 6. FIG. 7c illustrates biassing voltage-versus temperature characteristics of the FIGS. 7a and 7b biassing voltage sources DC1, DC2. In FIG. 7c, the temperature T is plotted on the horizontal axis and the percentage of deviation in biassing voltage ΔVdc(%) with regard to the biassing voltage at 25 degrees Celsius is plotted on the vertical axis.

CLOSING REMARKS

The drawings and their description illustrate rather than limit the invention. It will be evident that there are numerous alternatives which fall within the scope of the appended Claims. In this respect, the following closing remarks are made.

There are numerous ways of physically spreading functions or functional elements over various units. In this respect, the drawings are very diagrammatic, each representing only one possible embodiment of the invention.

What is claimed is:

1. An oscillator comprising means for compensating a frequency-drift by varying a biassing parameter in the oscillator, wherein the compensating means is arranged to vary various different biassing parameters in the oscillator, characterized in that the compensating means is arranged to vary a biassing voltage at a control terminal of an amplifying transistor forming a part of an oscillation loop in the oscillator.

2. The oscillator as claimed in claim 1, characterized in that the compensating means is arranged to vary a biassing voltage at a main current terminal of an amplifying transistor forming a part of an oscillation loop in the oscillator.

3. The oscillator as claimed in claim 1, characterized in that the compensating means is arranged to vary a biassing current at a main current terminal of an amplifying transistor forming a part of an oscillation loop in the oscillator.

4. An oscillator comprising means for compensating a frequency-drift by varying a biassing parameter in the oscillator, wherein the compensating means is arranged to vary various different biassing parameters in the oscillator, characterized in that the compensating means is arranged to vary a biassing current of a buffer transistor for deriving an oscillation output signal from an oscillation loop in the oscillator.

5. The oscillator as claimed in claim 4, characterized in that the compensating means is arranged to vary a biassing voltage at a main current terminal of an amplifying transistor forming a part of an oscillation loop in the oscillator.

6. The oscillator as claimed in claim 4, characterized in that the compensating means is arranged to vary a biassing current at a main current terminal of an amplifying transistor forming a part of an oscillation loop in the oscillator.

7. An integrated circuit for connection to an external resonant circuit so as to form an oscillator, the integrated circuit comprising means for compensating a frequency-drift of the oscillator by varying various different biassing parameters in the integrated circuit.

8. A receiver comprising an oscillator formed by a resonant circuit coupled to an integrated circuit as claimed in claim 7.

* * * * *